United States Patent
Kess

(10) Patent No.: US 8,111,139 B2
(45) Date of Patent: Feb. 7, 2012

(54) ARRANGEMENT FOR MONITORING A SWITCHING STATE OF A SWITCH

(75) Inventor: Helmut Kess, Erlangen (DE)

(73) Assignee: Siemens Aktiengesellschaft, München (DE)

( * ) Notice: Subject to any disclaimer, the term of this patent is extended or adjusted under 35 U.S.C. 154(b) by 361 days.

(21) Appl. No.: 12/513,427

(22) PCT Filed: Apr. 17, 2008

(86) PCT No.: PCT/EP2008/054669
§ 371 (c)(1),
(2), (4) Date: May 4, 2009

(87) PCT Pub. No.: WO2008/128963
PCT Pub. Date: Oct. 30, 2008

(65) Prior Publication Data
US 2010/0060426 A1    Mar. 11, 2010

(30) Foreign Application Priority Data

Apr. 24, 2007 (DE) .......................... 10 2007 019 339

(51) Int. Cl.
*H04Q 5/22* (2006.01)
(52) U.S. Cl. .................. 340/10.1; 340/572.1; 340/545.7
(58) Field of Classification Search .................... None
See application file for complete search history.

(56) References Cited

FOREIGN PATENT DOCUMENTS

| DE | 102 58 919 | 7/2004 |
|---|---|---|
| DE | 10 2005 049 819 | 11/2006 |
| DE | 10 2005 036 290 | 2/2007 |
| DE | 10 2006 027 437 | 12/2007 |
| EP | 1 231 699 | 8/2002 |
| GB | 2 395 626 | 5/2004 |

*Primary Examiner* — Brian Zimmerman
*Assistant Examiner* — Sara Samson
(74) *Attorney, Agent, or Firm* — Schiff Hardin LLP

(57) ABSTRACT

An arrangement for monitoring the switching state of a switch has a monitoring circuit that monitors a circuit containing a first switch. The monitoring circuit has RFID electronics and a second switch. An outlet of the RFID electronics is connected in series with an RFID antenna, and the second switch is connected to an input of the RFID electronics, such that the second switch opens or closes the monitoring circuit dependent on the switching state thereof. The first and second switches are coupled to each other so that the switching state of the second switch is controlled as a function of the switching state of the first switch, so the switching state of the second switch represents the switching state of the first switch. An RFID reading device is within range of the RFID antenna, and feeds a query signal via the RFID antenna into the monitoring circuit to determine the representative switching state of the first switch via the switching state of the second switch.

4 Claims, 1 Drawing Sheet

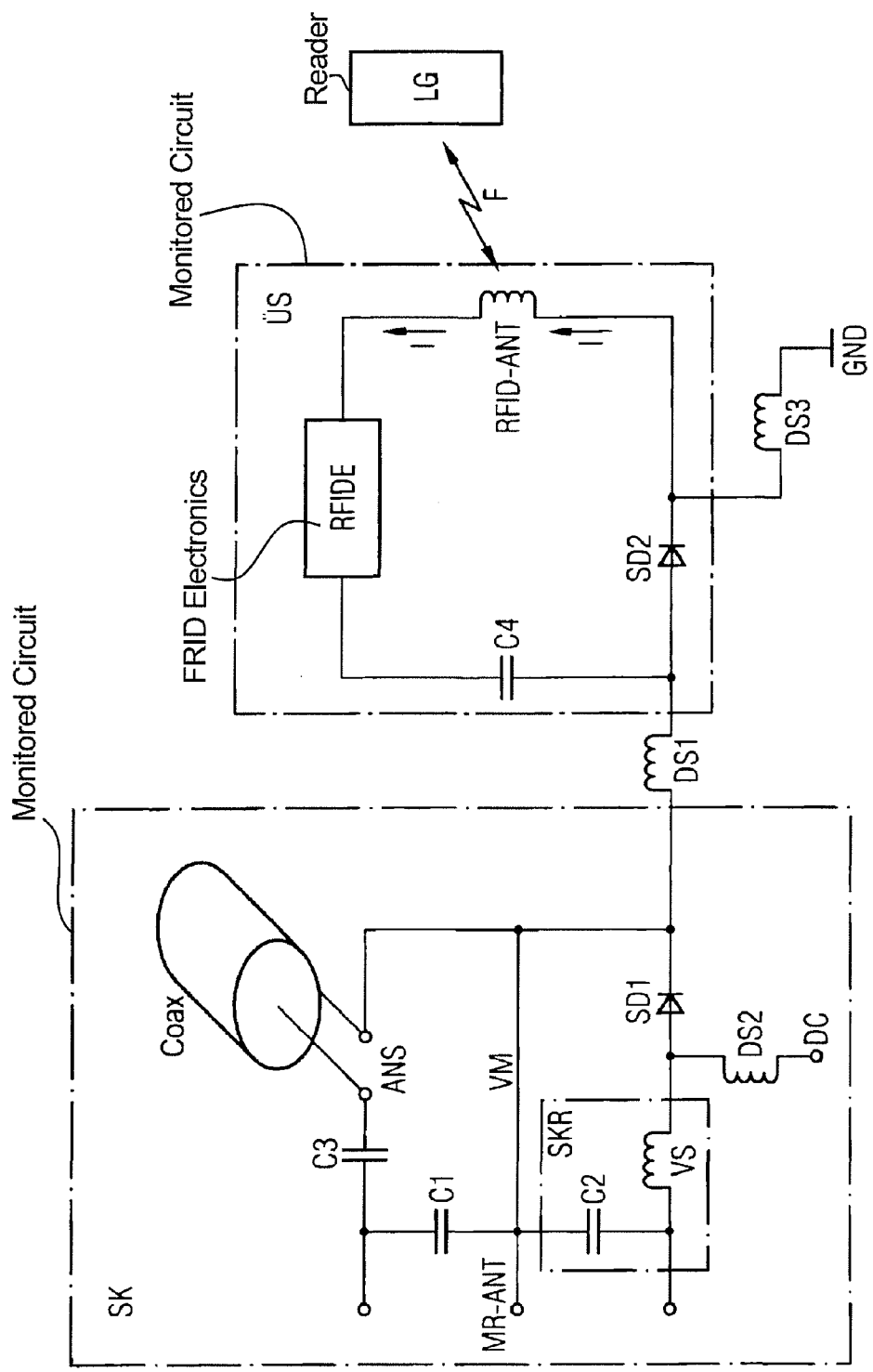

ARRANGEMENT FOR MONITORING A SWITCHING STATE OF A SWITCH

BACKGROUND OF THE INVENTION

1. Field of the Invention

The invention concerns an arrangement to monitor a switching state of a switch.

2. Description of the Prior Art

It is known to monitor switching states of a switch with the aid of complicated electronic circuits. Due to their complex design such monitoring circuits are subject to uncertainty factors that hinder the reliable monitoring.

SUMMARY OF THE INVENTION

An object of the present invention is to provide an arrangement that can be realized with little effort for monitoring switching state of a switch.

The above object is achieved in accordance with the invention by an arrangement for monitoring a switching state of a switch that has a monitoring circuit and a circuit that contains a first switch to be monitored.

In accordance with the invention the monitoring circuit has RFID electronics, an RFID antenna and a second switch, wherein an output of the RFID electronics is connected via a series circuit of the RFID antenna and of the second switch with an input of the RFID electronics. The second switch opens or closes the monitoring circuit due to its switching state.

The first and second switches are coupled with one another so that the switching state of the second switch is controlled depending on the switching state of the first switch. The switching state of the second switch therefore represents the switching state of the first switch.

An RFID reader is arranged within the reception range of the RFID antenna, and a query signal is injected by the RFID reader into the monitoring circuit via the RFID antenna in order to determine the representative switching state of the first switch via the switching state of the second switch. The switching state of the second switch therefore represents the switching state of the first switch.

Switching processes of a switch to be monitored are thus monitored using RFID modules, with the aid of the present invention.

Diodes are preferably used as switches to be monitored.

Due to the large quantities of available RFID modules, the arrangement according to the invention can be realized cost-effectively with little effort.

BRIEF DESCRIPTION OF THE DRAWING

The single FIGURE schematically illustrates an arrangement for monitoring the switching state of a switch in accordance with the present invention.

DESCRIPTION OF THE PREFERRED EMBODIMENTS

The switch SD1 to be monitored is arranged in a circuit SK together with a number of additional, discrete components described in the following.

A signal such as from a magnetic resonance antenna MR-ANT in the exemplary embodiment arrives at the first switch SD1 (fashioned as a diode) via a blocking circuit SKR that has an inductance VS and a capacitor C2 set to a virtual ground VM.

The signal of the magnetic resonance antenna MR-ANT arrives at a coaxial cable Coax via a series circuit composed of a capacitance C1 and a capacitance C3.

The inductors DS1, DS2, DS3 designed as chokes are used for radio-frequency decoupling. The capacitors or capacitances C2 and C4 serve for DC decoupling.

When the block circuit SKR is tuned so as to be conducting, the first switch SD1 is closed so that a current can flow across the first switch SD1. In this case the magnetic resonance antenna MR-ANT is detuned (thus inactive).

In the event that the blocking circuit SKR is blocked (non-conducting), the first switch SD1 is open because no current can flow across the first switch SD1. The magnetic resonance antenna MR-ANT is tuned (thus ready to receive).

In the arrangement according to the invention, the first switch SD1 and a second switch SD2 that is a component of a monitoring circuit US are serially coupled with one another via an inductance DS1 designed as a choke.

Via this serial coupling, the switching state "open" or "closed" of the second switch SD2 is controlled depending on the switching state "open" or "closed" of the first switch SD1. The switching state of the second switch SD2 therefore represents the switching state of the first switch SD1.

The monitoring circuit US has RFID electronics RFIDE and an RFID antenna RFID-ANT as RFID modules. Furthermore, the monitoring circuit US includes the second switch SD2 designed as a diode as well as a capacitance C4.

An output of the RFID electronics RFIDE is connected via a series circuit of the RFID antenna RFID-ANT and the second switch SD2 with an input of the RFID electronic RFIDE so that the second switch SD2 opens or closes the monitoring circuit US due to its "open" or "closed" switching state.

For example, the RFID electronics RFIDE contains a transponder with an individually assigned transponder identifier. With the use of the transponder identifier it is (in this application case) possible to unambiguously associate respective RFID queries with the switch SD1 to be monitored.

A reader LG is arranged in the reception range of the RFID antenna that is advantageously fashioned as an antenna coil.

The reader LG emits a radio-frequency electromagnetic field F via an integrated antenna (not shown here). This field F is received by the RFID antenna RFID-ANT and transformed into an induction current I. The RFID electronics RFIDE can be activated via the induction current I.

In passive RFID modules, the capacitor C4 is charged by the induction current I in order to ensure with its help a power supply of the RFID electronics RFIDE.

After the activation of the RFID electronics RFIDE, commands are received as a query signal of the reader LG, which commands are transferred in modulated form in the radiated field F.

Given a closed second switch SD2 it is possible to modulate a response to the commands in the field F emitted by the reader LG. This response could be the transponder identifier, for example.

The reader LG only receives a response when the second switch SD2 (and therefore the monitoring circuit US) is closed. Since the second switch SD2 represents the switching state of the first switch SD1, a closed switching state of the first switch SD1 can be concluded from the present response, for example.

The reader LG receives no response when the second switch SD2 is open and the monitoring circuit US is open. Since this second switch SD2 represents the switching state of the first switch SD1, an open switching state of the first switch SD1 can be concluded from the absent response, for example.

The RFID modules are preferably tuned to a frequency of 13.56 MHz.

Although modifications and changes may be suggested by those skilled in the art, it is the intention of the inventor to embody within the patent warranted hereon all changes and modifications as reasonably and properly come within the scope of his or her contribution to the art.

I claim as my invention:

1. An arrangement for monitoring a switching state of a switch, comprising:

a monitoring circuit electrically connected to a first switch, as a switch to be monitored;

said monitoring circuit comprising RFID electronics, an RFID antenna and a second switch, said RFID electronics comprising an output connected via a series circuit of the RFID antenna and the second switch with an input of the RFID electronics to cause the second switch to open or close the monitoring circuit dependent on the switching state of the second switch;

said first switch and said second switch being coupled with each other to cause the switching state of the second switch to be controlled dependent on the switching state of the first switch so the switching state of the second switch represents the switching state of the first switch; and an RFID reader located within a reception range of said RFID antenna, said RFID reader being configured to inject a query signal into the monitor circuit via the RFID antenna to determine the switching state of the first switch as represented by the switching state of the second switch.

2. An arrangement as claimed in claim 1 wherein a response of the RFID electronics to the RFID reader is transferred, given a closed second switch, to indicate the represented switching state of the first switch.

3. An arrangement as claimed in claim 1 wherein said first switch and said second switch are coupled by a series connection.

4. An arrangement as claimed in claim 1 wherein said first switch and said second switch are coupled by an inductance there between.

* * * * *